US012628606B2

(12) United States Patent
Wang et al.

(10) Patent No.: US 12,628,606 B2
(45) Date of Patent: May 12, 2026

(54) LASER BEAM ADJUSTMENT IN SEMICONDUCTOR DEVICE FABRICATION

(71) Applicant: Taiwan Semiconductor Manufacturing Company Limited, Hsin-Chu (TW)

(72) Inventors: Wei-Fu Wang, Hsin-Chu County (TW); Yi-Chao Wang, Hsinchu (TW); Li-Ting Wang, Hsinchu (TW); Yee-Chia Yeo, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 957 days.

(21) Appl. No.: 17/746,403

(22) Filed: May 17, 2022

(65) Prior Publication Data

US 2023/0377915 A1    Nov. 23, 2023

(51) Int. Cl.
H01L 21/67        (2006.01)
(52) U.S. Cl.
CPC .. H01L 21/67115 (2013.01); H01L 21/67253 (2013.01)

(58) Field of Classification Search
None
See application file for complete search history.

(56)            References Cited

U.S. PATENT DOCUMENTS

2013/0257461 A1*  10/2013  Heidmann ......... G01R 31/2656
                                                    324/703
2014/0179027 A1*   6/2014  Tseng .................... G01J 1/4257
                                                    219/121.62

* cited by examiner

*Primary Examiner* — Alexander G Ghyka
(74) *Attorney, Agent, or Firm* — Cooper Legal Group, LLC

(57)            ABSTRACT

An intensity of a power laser beam applied to a semiconductor device is adjusted. An applied intensity of the power laser beam is indicative of a magnitude at which the power laser beam is emitted toward the semiconductor device and a reflection intensity of a probing laser beam applied to the semiconductor device is indicative of an emissivity of the semiconductor device. The reflection intensity of the probing laser beam is measured to determine the emissivity of the semiconductor device and the applied intensity of the power laser beam is adjusted as a function of the emissivity.

20 Claims, 6 Drawing Sheets

300

500

502 — apply power laser beam to semiconductor device

504 — measure reflection intensity of probing laser beam to determine emissivity of semiconductor device 506 — adjust applied intensity of power laser beam as function of emissivity

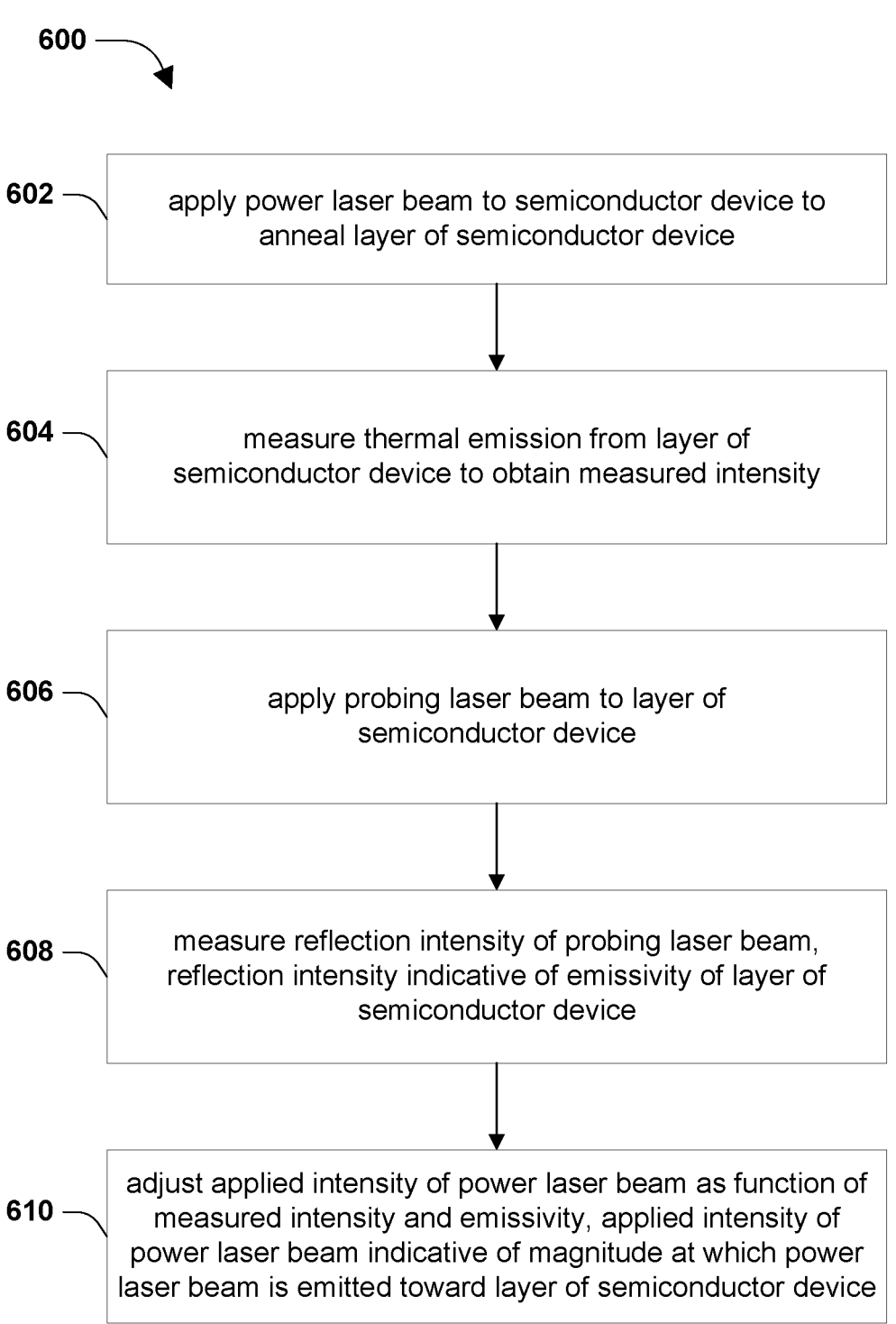

600

602 — apply power laser beam to semiconductor device to anneal layer of semiconductor device 604 — measure thermal emission from layer of semiconductor device to obtain measured intensity 606 — apply probing laser beam to layer of semiconductor device 608 — measure reflection intensity of probing laser beam, reflection intensity indicative of emissivity of layer of semiconductor device 610 — adjust applied intensity of power laser beam as function of measured intensity and emissivity, applied intensity of power laser beam indicative of magnitude at which power laser beam is emitted toward layer of semiconductor device

FIG. 6

LASER BEAM ADJUSTMENT IN SEMICONDUCTOR DEVICE FABRICATION

BACKGROUND

Semiconductor devices are electronic components that are fabricated on a semiconductor wafer. Using a variety of fabrication techniques, semiconductor devices are made and connected together to form integrated circuits. A number of integrated circuits may be grouped on semiconductor chip, which is diced from a semiconductor wafer. Such components and/or integrated circuits are capable of performing a set of useful operations in an electronic appliance. Examples of such electronic appliances are mobile telephones, personal computers, personal gaming devices, etc. Accordingly, semiconductor manufacturers are pressed to create smaller and faster semiconductor circuits that also consume less power (e.g., to improve energy efficiency and/or reduce battery consumption). Integrated circuits including field-effect transistors (FETs), such as complementary-metal-oxide-semiconductors (CMOSs), have grown in popularity due to this demand for smaller, faster, and/or more energy efficient circuitry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 illustrates an example method, according to some embodiments.

DETAILED DESCRIPTION

Figure 1:
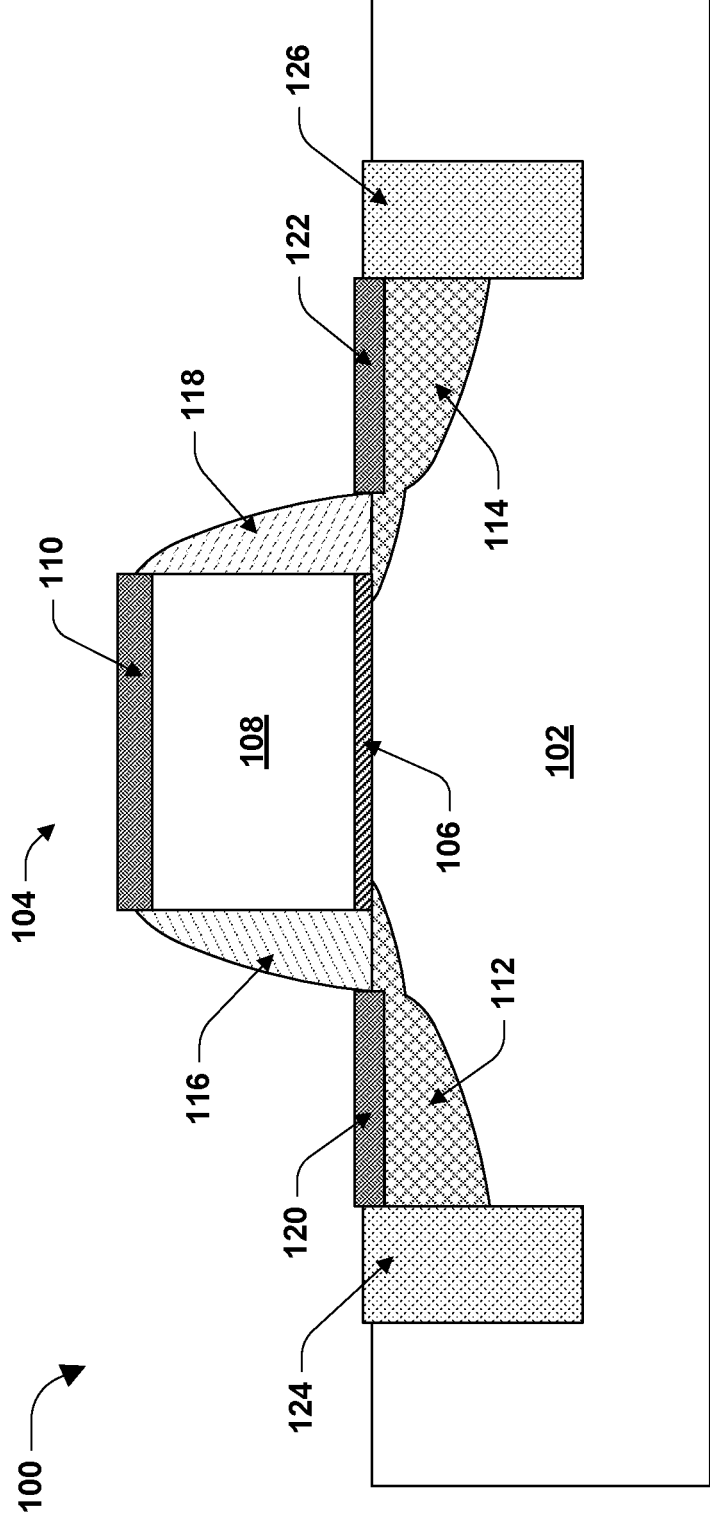
FIG. 1 illustrates a cross-sectional view of a semiconductor device, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and the like, may be used herein to describe both direct and indirect relationships. "Directly" connected, adjacent, or coupled may refer to a relationship in which there are no intervening components, devices, or structures. "Indirectly" connected, adjacent, or coupled may refer to a relationship in which there are intervening components, devices, or structures.

Semiconductors are formed using a variety of operations. Example operations include, among other things, physical vapor deposition (PVD), chemical vapor deposition (CVD), atomic layer deposition (ALD), plating, epitaxially growing, etc. Another operation frequently utilized is an anneal operation, where the semiconductor device (e.g., or a portion thereof, such as a single layer of the semiconductor device) is heated to change a property or properties of the semiconductor device. In some embodiments, one or more of such processes include the use of a power laser to perform an anneal operation. The power laser may be configured to apply a power laser beam to a region of the semiconductor wafer, a semiconductor device of the semiconductor wafer, a component of the semiconductor wafer, or other portion of the semiconductor wafer. For example, in some embodiments, the anneal operation includes using a power laser beam to heat the semiconductor device (e.g., or merely a portion of the semiconductor device).

In some embodiments, the power laser beam may perform a laser-spike anneal operation where the portion of the semiconductor wafer is heated and spikes in temperature. The power laser beam may be changed in intensity, based on the portion to which it is applied, to change the temperature of the portion. According to some embodiments, different portions of a semiconductor wafer may be heated to different temperatures and different semiconductor wafers may be heated to different temperatures. In some embodiments, an emission detector is configured to detect a measured intensity of thermal emission from the portion of the semiconductor wafer. A read temperature of the portion of the semiconductor device may be calculated based on the measured intensity. The read temperature may be compared to a set temperature, according to a recipe, for performing the anneal operation with closed-loop control on the portion of the semiconductor device. As set forth in greater detail herein, the read temperature may be more accurately determined and the anneal operation may be more precisely controlled when an emissivity of the portion of the semiconductor wafer is known. In some embodiments, the read temperature may be more accurately determined during closed-loop control of the power laser when the emissivity of the portion of the semiconductor wafer is determined during processing of the semiconductor wafer.

In some embodiments, a probing laser is configured to emit a probing laser beam onto the portion of the semiconductor wafer and a probing sensor is configured to measure a reflection intensity of the probing laser beam, where the reflection intensity is indicative of an emissivity of the portion of the semiconductor wafer. An emissivity of the semiconductor wafer or the portion of the semiconductor wafer may change as a function of one or more factors. Examples of factors that may affect emissivity include a type of semiconductor wafer (e.g., a bulk silicon wafer, a semiconductor device wafer, etc.), a type of component to be processed (e.g., a transistor, a p-n junction, a gate electrode, etc.), a layer to be processed, or other factors alone or in combination.

According to some embodiments, an intensity of the power laser beam applied to a semiconductor device is adjusted, where an applied intensity of the power laser beam is indicative of a magnitude at which the power laser beam is emitted toward the semiconductor device and where a reflection intensity of a probing laser beam applied to the semiconductor device is indicative of an emissivity of the semiconductor device. In some embodiments, the reflection intensity of the probing laser beam is measured to determine the emissivity of the semiconductor device and the applied intensity of the power laser beam is adjusted as a function of the emissivity. Such adjustment as a function of emissivity may provide more precise temperature determination during closed-loop control of the power laser beam with different incoming wafer conditions. For example, semiconductor wafers with different semiconductor device sizes (e.g., different node sizes) may be processed with greater precision, greater yield, and/or improved wafer-to-wafer uniformity.

FIG. 1 illustrates a cross-sectional view of a semiconductor device 100, according to some embodiments. In some embodiments, the semiconductor device 100 is at least partially formed by applying a power laser beam to the semiconductor device 100. In the illustrated embodiment, the semiconductor device 100 is a field-effect transistor (FET), although the present disclosure, including the scope of the claims, is not intended to be limited to a field-effect transistor. For example, in other embodiments, the semiconductor device 100 comprises other components such as resistors, capacitors, memory cells, light emitting diodes, shallow trench isolation (STI) regions, gate electrodes, semiconductor fins, etc. The semiconductor device 100 is formed on a substrate 102 (e.g., a portion of a semiconductor wafer). In some embodiments, the substrate 102 is a silicon substrate. Other example materials for the substrate 102 include, among other things, germanium, diamond, silicon carbide, gallium arsenide, indium arsenide, indium phosphide, etc. In some embodiments, the substrate 102 may be, for example, a bulk Si wafer, a bulk germanium (Ge) wafer, a semiconductor-on-insulator (SOI) substrate, a strained semiconductor-on-insulator (SSOI) substrate, or other type of substrate. The substrate 102 may include a semiconductor material, such as a group IV element, e.g., Ge or Si, a III-V compound, a II-VI compound, or another type of compound. In some embodiments, an anneal operation is performed on the substrate 102 to allow dopants, such as boron, phosphorous, or arsenic, for example, to diffuse into the substrate. In some embodiments, the anneal operation is a laser-spike anneal operation to activate dopants in a micro second (μS) to millisecond (mS) time frame with temperature control such that the activated dopants maintain a solid phase without liquid migration.

According to some embodiments, the semiconductor device 100 includes a gate stack 104, a source region 112, and a drain region 114 formed on or within the substrate 102. In the example embodiment, the gate stack 104 includes a gate dielectric layer 106 and a gate electrode 108. The gate dielectric layer 106 adjoins the substrate 102 and is comprised of a dielectric material, such as metal oxides, metal nitrides, metal silicates, transition metal-oxides, transition metal-nitrides, transition metal-silicates, oxynitrides of metals, metal aluminates, zirconium silicate, zirconium aluminate, for example. The gate electrode 108 comprises one or more layers, which includes interface layers, capping layers, and/or sacrificial layers, for example. By way of example, in some embodiments, the gate electrode 108 comprises a polysilicon layer. In some embodiments, one or more dopant materials, such as p-type dopants or n-type dopants, are added to the one or more layers of the gate electrode 108, such as the polysilicon layer, for example. Example techniques for forming such layers include physical vapor deposition (PVD), chemical vapor deposition (CVD), atomic layer deposition (ALD), and/or plating, for example.

In the illustrated embodiment, the gate stack 104 further comprises a silicide region 110 that is formed above the gate electrode (e.g., on a diametrically opposite side of the gate electrode 108 relative to the gate dielectric layer 106). In some embodiments, the silicide region 110 is configured to reduce contact resistance at the gate stack 104 (e.g., to reduce gate resistance), thereby affecting (e.g., improving) one or more operating characteristics of the semiconductor device 100, for example. Example materials for the silicide region 110 include metal silicides, such as cobalt silicide, titanium silicide, nickel silicide, platinum silicide, tantalum silicide, tungsten silicide, etc., for example. In some embodiments, the silicide region 110 is formed by depositing a layer of metal and performing an anneal operation on the metal to convert the metal into a metal silicide, such as by reacting the metal with polysilicon of the gate electrode 108, for example. In other embodiments, other suitable techniques are utilized to form the silicide region 110.

The source region 112 is typically formed in the substrate 102 on a first side of the gate stack 104 and the drain region 114 is typically formed in the substrate 102 on a diametrically opposite side of the gate stack 104. The source region 112 and the drain region 114 respectively comprise a semiconductor material, such as a monocrystalline semiconductor material. In some embodiments, the source region 112 and the drain region 114 comprise a substantially same semiconductor material. In other embodiments, the source region 112 comprises a different semiconductor material or a different concentration of the semiconductor material relative to the drain region 114. In some embodiments, the source region 112 and the drain region 114 are formed by an implantation process to form/define the source region 112 and the drain region 114 (e.g., wherein the implantation process introduces dopants, such as arsenic, phosphorous, boron, etc., into the substrate 102), for example. For example, the source region 112 and the drain region 114 may include implanted p-type or n-type impurities that may be activated using a laser anneal operation as set forth herein. In other embodiments, other suitable techniques are utilized to form the source region 112 or the drain region 114.

According to some embodiments, the semiconductor device 100 includes sidewall spacers 116, 118, which are formed on opposite sidewalls of the gate stack 104. In some embodiments, a first sidewall spacer 116 is comprised of one or more layers of dielectric material and a second sidewall spacer 118 is comprised of one or more layers of dielectric material. As an example, in some embodiments, the first sidewall spacer 116 and the second sidewall spacer 118 respectively comprise two layers. A first layer of the two layers includes a nitride composition, such as silicon nitride, and the second layer of the two layers includes an oxide composition, such as silicon oxide, for example. Other example materials for one or more layers of the first sidewall spacer 116 or the second sidewall spacer 118 include silicon carbide and silicon oxynitride, for example. In some embodiments, such sidewall spacers 116, 118 facilitate lateral electric distance control, for example. In other embodiment, the sidewall spacers 116,118 facilitate defining the source region 112 and the drain region 114, such as by directing implanted dopants into particular regions of the substrate 102, for example.

In the illustrated embodiment, the semiconductor device 100 includes a second silicide region 120 formed spatially proximate the source region 112 and a third silicide region 122 formed spatially proximate the drain region 114. More particularly, the second silicide region 120 is positioned on top of the source region 112 (e.g., to cap the source region 112) and the third silicide region 122 is positioned on top of the drain region 114 (e.g., to cap the drain region 114). In some embodiments, the second silicide region 120 is configured to reduce contact resistance at the source region 112 (e.g., to reduce source resistance) and the third silicide region 122 is configured to reduce contact resistance at the drain region 114 (e.g., to reduce drain resistance), thereby affecting (e.g., improving) one or more operating characteristics of the semiconductor device 100, for example. Example materials for the silicide regions 120, 122 include metal silicides, such as cobalt silicide, titanium silicide, nickel silicide, platinum silicide, tantalum silicide, tungsten silicide, etc. In some embodiments, the second silicide region 120 and the third silicide region 122 are formed by depositing a layer of metal and performing an anneal operation on the metal to convert the metal into a metal silicide. In other embodiments, other suitable techniques are utilized to form the second silicide region 120 and the third silicide region 122.

In some embodiments, source/drain contact plugs may be used for electrically coupling to the source region 112 and the drain region 114, which may be formed through epitaxy. In some embodiments, the formation of the source/drain silicide regions, set forth herein, includes forming contact openings by etching dielectric layers covering the source/drain regions. For example, etched dielectric layers may include a silicon nitride layer and an oxide layer over the silicon nitride layer. In this case, the source/drain regions may be exposed to the contact openings. In some embodiments, an additional silicon nitride layer is formed conformally to cover the sidewalls and the bottoms of the contact openings, as set forth herein. A second etching step may then be performed to remove the bottom portions of the silicon nitride layer to reveal the epitaxy source/drain regions. In some embodiments, a metal layer may be formed to extend into the contact openings, and a laser anneal process is performed to react the metal layer with the source/drain regions, resulting in formation of the source/drain silicide regions. In some embodiments, the remaining portions of the contact openings may be filled with a metal to form the source/drain contact plugs.

In some embodiments, the semiconductor device 100 is electrically isolated from one or more neighboring semiconductor devices (not shown) (e.g., such as other FETs) via an isolation layer. By way of example, in the illustrated embodiment, the semiconductor device 100 is electrically isolated from neighboring semiconductor devices via a first isolation layer 124 located spatially proximate the source region 112 and a second isolation layer 126 located spatially proximate the drain region 114. In other embodiments, the semiconductor device 100 is electrically isolated from neighboring semiconductor devices at merely the source region or merely the drain region. As an example, in some embodiments, an isolation layer is formed proximate the source region 112 but not the drain region 114. In at least some of these embodiments, the drain region 114 of the semiconductor device 100 functions as a source or a drain for a second semiconductor device, for example. In still other embodiments, no isolation layers are present between the semiconductor device and other neighboring semiconductor devices. In some embodiments, such isolation layers 124, 126 are formed by respectively etching recesses in the substrate 102 and at least partially filling the recesses with a dielectric material or substantially non-conductive material. Other arrangements and/or configurations of the semiconductor device 100 are within the scope of the present disclosure.

Figure 2:
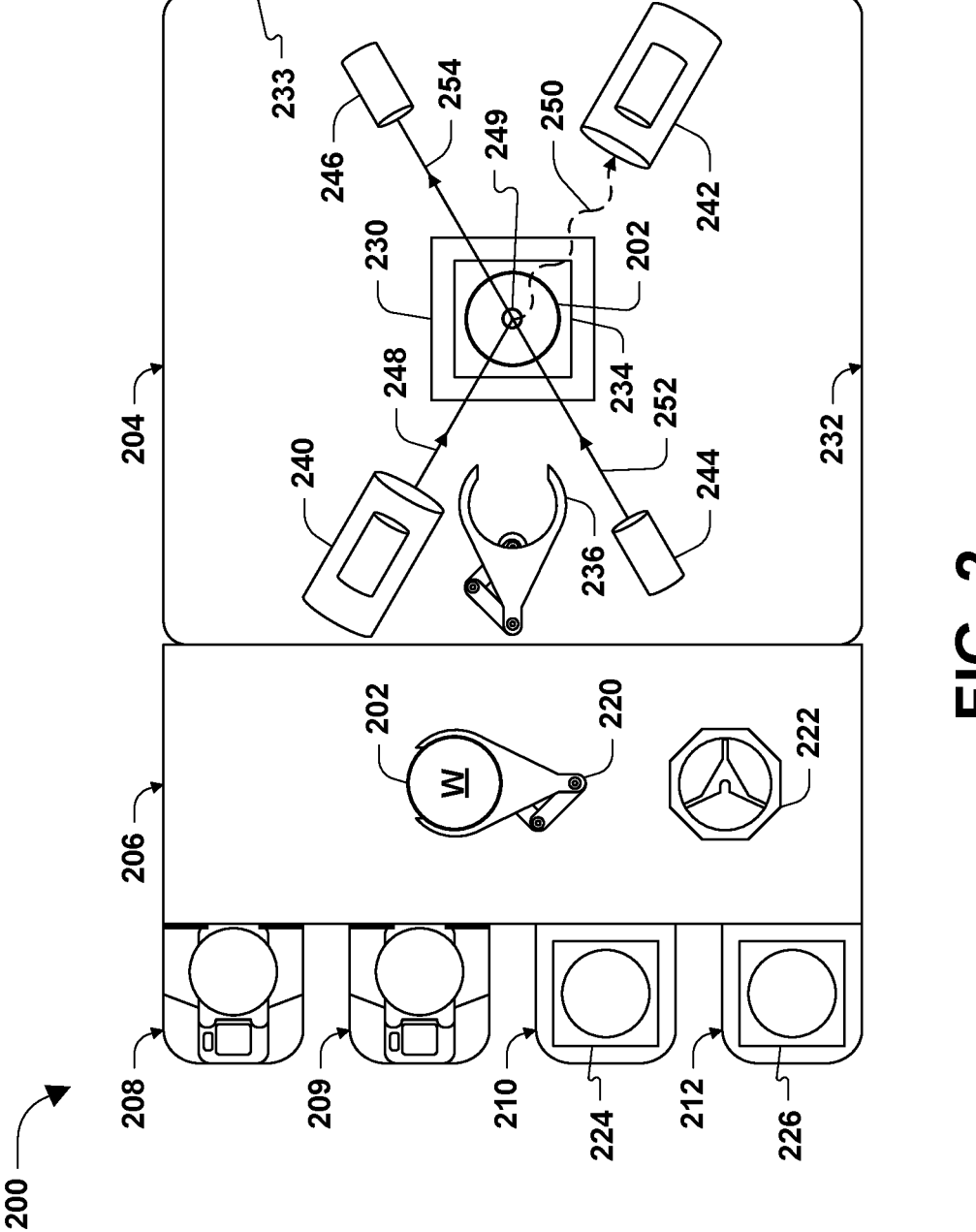
FIG. 2 illustrates an implementation of laser beam adjustment for semiconductor fabrication, according to some embodiments.

FIG. 2 illustrates an implementation 200 of laser beam adjustment for semiconductor fabrication, according to some embodiments. The implementation 200 includes components for performing an anneal operation on a semiconductor wafer 202. In some embodiments, the implementation 200 includes a laser anneal module 204, an interface module 206, a wafer storage device 208, a second wafer storage device 209, a pre-heat module 210, and a post-cool module 212. The laser anneal module 204 is configured to perform a laser anneal operation on a region of the semiconductor wafer 202, a semiconductor device of the semiconductor wafer 202, a component of the semiconductor wafer 202, and/or other portion of the semiconductor wafer 202. In some embodiments, the semiconductor wafer 202, the semiconductor device of the semiconductor wafer 202, the component of the semiconductor wafer 202, and/or other portion of the semiconductor wafer 202 corresponds to at least some of the semiconductor device 100 illustrated in FIG. 1.

According to some embodiments, the implementation 200 includes one or more wafer storage devices, such as the wafer storage device 208 and the second wafer storage device 209, to house a plurality of semiconductor waters, such as the semiconductor wafer 202, before and/or after transfer to interface module 206. In some embodiments, the wafer storage device 208 may be configured as a standard mechanical interface (SMIF), a front opening unified pod (FOUP), a front opening shipping box (FOSB), or other type of wafer storage device, to retain a plurality of semiconductor wafers therein. In some embodiments, the wafer storage device 208 may include a carousel comprising an elevator chamber that accepts cassettes to be loaded with semiconductor wafers. The wafer storage device 208 may be loaded onto a load port to provide an ultra-clean environment within the wafer storage device 208. For example, a cleaning gas may be added to the wafer storage device 208 by the load port through a gas inlet and the cleaning gas may be exhausted from the wafer storage device 208 through a gas outlet. Other arrangements and/or configurations of the wafer storage device 208 are within the scope of the present disclosure.

According to some embodiments, the implementation 200 includes the interface module 206 to house a plurality of semiconductor wafers, such as the semiconductor wafer 202, before and/or after transfer into the laser anneal module 204. The interface module 206 may be configured as a facility interface, an equipment front end module (EFEM), or other type of interface module. In some embodiments, the interface module 206 includes an operating machine 220, such as a robotic arm, a track based extension member, or other mechanical device. The operating machine 220 may be configured to transfer the semiconductor wafer 202 between the wafer storage device 208, the pre-heat module 210, the post-cool module 212, the laser anneal module 204, or another type of module for processing. In some embodiments, the interface module 206 may include a fan filter unit (not shown) to create and/or maintain a mini environment within the interface module 206. The fan filter unit may draw air through a top portion thereof by a fan unit, which is then filtered by a filter unit for introduction into the interface module 206. In some embodiments, air from within the interface module 206 may be exhausted through a bottom portion thereof from a vacuum source, such as a vacuum pump.

In some embodiments, the interface module 206 includes a notch aligner 222 to align semiconductor wafers for processing. The notch aligner 222 may include a notch sensor (not shown), such as an optical sensor, to determine notch positions of semiconductor wafers and provide correct alignment during processing. The notch aligner 222 may include an optical diffuser (not shown) to mitigate disruptive optical reflections from the semiconductor wafer 202 for sensing of a notch position by the notch sensor. In some embodiments, wafer alignment may be performed through contact or non-contact detection of one or more alignment marks, also known as a notch, formed on a surface of the semiconductor wafer 202. For example, the semiconductor wafer 202 may be placed onto an alignment chuck or onto resting pins, depending on the shape of an end effector of the operating machine 220. The alignment chuck may be equipped, for example, with two servo-axes, X and Y, which enable it to move underneath the semiconductor wafer 202 and compensate for misalignments. In some embodiments, notch aligner may provide wafer displacement measurement, calculation of necessary compensation, and orientation of the alignment mark to a desired angle based on a measurement of wafer eccentricity and orientation of placement onto the alignment chuck. In some embodiments, a thru-beam array laser optic sensor, including a transmitter and receiver, is positioned above and below the semiconductor wafer 202. The semiconductor wafer 202 may then be rotated until the notch is found. In some embodiments, the notch aligner 222 may provide position correction using an optical sensor, such as a CCD sensor in combination with a high-resolution, a low-density laser beam (e.g., in contrast to a thru-beam array laser optic sensor). In some embodiments, the semiconductor wafer 202 is rotated 360° during notch alignment to perform edge detection and calculate a position value of the notch according to a gap size obtained from the CCD sensor.

In some embodiments, a load lock module may be configured as an interface between the interface module 206 and the laser anneal module. The load lock module may generally approximate conditions within the laser anneal module 204, to mitigate introduction of media, such as dust, moisture, condensation, contaminants, etc., and/or to mitigate changes in temperature between the interface module 206 and the laser anneal module. For example, in some embodiments, the implementation 200 includes a plurality of separate laser anneal modules for parallel processing of separate semiconductor wafers. In some embodiments, the laser anneal modules, such as the laser anneal module 204, may maintain chamber temperatures above ambient temperature to facilitate the anneal operation the semiconductor wafer 202. The operating machine 220 may then transfer semiconductor wafers between the laser anneal modules and other components of the implementation 200 to increase workflow of semiconductor processing. Other arrangements and/or configurations of the interface module 206 are within the scope of the present disclosure.

According to some embodiments, the implementation 200 includes the pre-heat module 210 to pre-heat semiconductor wafers, such as the semiconductor wafer 202, before transfer into the laser anneal module 204. The pre-heat module 210 includes a heat source 224 to pre-heat the semiconductor wafer 202 prior to the anneal operation by the laser anneal module 204. As set forth in greater detail herein, the laser anneal module 204 includes a heated chuck that provides heat to the substrate 102 of the semiconductor wafer 202. In some embodiments, the heat source 224 of the pre-heat module 210 pre-heats the semiconductor wafer 202 to a temperature approximating heat applied by the heated chuck, according to a recipe. In various embodiments, the recipe for laser anneal may vary and the heat applied by the heat source 224 may vary, such that the temperature of the substrate 102 is between 100° C. and 500° C. For example, a substrate temperature of about 150° C. may improve absorption of a power laser beam while reducing phase transformation in some low temperature semiconductor devices, such as from a Ni-rich silicide to nickel monosilicide (NiSi). In some embodiments, formation of a silicide such as NiSi is preferred, and the temperature of the substrate 102 may be heated by the heat source 224 between 350° C. and 450° C., such as about 400° C. Heat migrates through the semiconductor wafer 202 in response to temperature and time of application. In some embodiments, the substrate 102 may be heated between 350° C. and 450° C. by the heat source 224 for a time period between 50 seconds (S) and 150 S, such as about 100 S. In some embodiments, the heat source 224 is an oven that provides radiant heat to the semiconductor wafer 202 and air within the pre-heat module 210. In some embodiments, the heat source 224 is a pre-heat laser that uniformly heats the semiconductor wafer 202 as a whole within the pre-heat module 210. In some embodiments, the heat source 224 is a heat plate that that provides heat to the substrate 102 of the semiconductor wafer 202, such as about 400° C. for about 100 S. In some embodiments, the heat source 224 includes one or more of an oven, a pre-heat laser, a heat plate, or other heat source. Other arrangements and/or configurations of the pre-heat module 210 are within the scope of the present disclosure. For example, the pre-heat module 210 may be included within a load lock module, set forth herein, and retrieved therefrom by an operating machine of the laser anneal module 204.

According to some embodiments, the implementation 200 includes the post-cool module 212 to cool semiconductor wafers, such as the semiconductor wafer 202, after transfer from the laser anneal module 204. The post-cool module 212 includes a cooling source 226 to controllably cool the semiconductor wafer 202 after the laser anneal operation. In some embodiments, controllably cooling the semiconductor wafer 202 may mitigate potential defects to the semiconductor wafer 202 itself and may mitigate potential transfer of heat from the semiconductor wafer 202 to other processing equipment. For example, the wafer storage device 208 may include a carousel and/or cassette comprising a plastic material that may be impacted by excess heat from the semiconductor wafer 202. In some embodiments, the cooling source 226 is a refrigerated chamber. In some embodiments, the cooling source 226 is a cooling plate that is cooled by a cooling liquid, such as flowing water or a refrigerant, to cool the substrate 102 of the semiconductor wafer 202. In some embodiments, the cooling source 226 includes one or more of a refrigerated chamber, a cooling plate, or other cooling source. In some embodiments, the cooling source 226 cools the semiconductor wafer 202 and/or the substrate 102 to about ambient temperature. Other arrangements and/or configurations of the post-cool module 212 are within the scope of the present disclosure.

According to some embodiments, the implementation 200 includes the laser anneal module 204 for performing an anneal operation on a region of the semiconductor wafer 202, the semiconductor device of the semiconductor wafer 202, a component of the semiconductor wafer 202, and/or other portion of the semiconductor wafer 202. In some embodiments, the semiconductor wafer 202 is positioned on a stage 230 within a laser anneal chamber 232 of the laser anneal module 204. In some embodiments, the stage 230 is configured to rotate during application of a power laser beam. For example, a relative velocity between the stage 230 and the power laser beam for the annealing operation may be in a range from 0.1 cm/s to 100 cm/s. A volume of the laser anneal chamber 232 may be greater than about 324 cm$^2$×0.1 cm for the annealing operation on an 8-inch semiconductor wafer. A volume of the laser anneal chamber 232 may be greater than about 700 cm$^2$×0.1 cm to apply for the annealing operation on a 12-inch wafer. The laser anneal chamber 232 includes a plurality of sidewalls, such as a sidewall 233, to define the laser anneal chamber 232 and support components therein.

In some embodiments, a heated chuck 234 is disposed between the semiconductor wafer 202 and the stage 230 such that the temperature of the substrate 102 of the semiconductor wafer 202 is between 100° C. and 500° C. In some embodiments, the temperature of the substrate 102 may be heated by the heated chuck 234 during the laser anneal operation between 350° C. and 450° C., such as about 400° C. In some embodiments, the semiconductor wafer 202 is positioned onto the stage 230 from a component external to the laser anneal module 204, such as by the operating machine 220 of the interface module 206. In some embodiments, the semiconductor wafer 202 is positioned onto the stage 230 by a component internal to the laser anneal module 204, such as by the robotic arm 236.

According to some embodiments, the laser anneal module 204 includes a power laser 240, an emission detector 242, a probing laser 244, and a probing sensor 246. In some embodiments, the power laser 240 is configured to emit a power laser beam 248 that performs an anneal operation on a region 249 of the semiconductor wafer 202. In some embodiments, the power laser 240 is a diode laser, a gas laser, a solid laser, or other type of laser. In some embodiments, the emission detector 242 is configured to detect a measured intensity of thermal emission 250 from the region 249 of the semiconductor wafer 202. In some embodiments, the probing laser 244 is configured to emit a probing laser beam 252 onto the region 249 of the semiconductor wafer 202 and the probing sensor 246 is configured to measure a reflection intensity of the probing laser beam 252. In some embodiments, the reflection intensity is a reflected laser beam 254 from a reflection of the probing laser beam 252 from the region 249 of the semiconductor wafer 202. The reflection intensity is indicative of an emissivity of the region 249 of the semiconductor wafer 202. In some embodiments, the implementation 200 is configured to adjust an applied intensity of the power laser beam 248 as a function of the measured intensity and the emissivity, where the applied intensity is indicative of a magnitude at which the power laser beam 248 is emitted from the power laser 240 toward the region 249 of the semiconductor wafer 202. In some embodiments, components of the laser anneal module 204, for example the power laser 240, the probing laser 244, the emission detector 242, and the probing sensor 246 may be affixed to a sidewall, such as the sidewall 233, within the laser anneal chamber 232. In some embodiments, one or more of the components of the laser anneal module 204 may be affixed external to the laser anneal chamber 232. For example, the power laser 240 may be affixed external to the laser anneal chamber 232 and the power laser beam may be transmitted to the semiconductor wafer 202 through a window or an opening defined in the laser anneal chamber 232. Other arrangements and/or configurations of the laser anneal module 204 are within the scope of the present disclosure.

According to some embodiments, the implementation 200 may perform a process sequence to perform the laser anneal operation. The semiconductor wafer 202 may be retrieved from the wafer storage device 208 by the operating machine 220 in the interface module 206. The operating machine 220 may then move the semiconductor wafer 202 onto the notch aligner 222 to detect notch positions on underside thereof and provide alignment of the semiconductor wafer 202 for subsequent processing. After determination of notch alignment, the operating machine 220 may transfer the semiconductor wafer 202 to the pre-heat module 210 to perform pre-heating, as set forth herein. After pre-heating of the semiconductor wafer 202 in the pre-heat module 210 (e.g., about 400° C. for about 100 S), the semiconductor wafer 202 may be transferred by the operating machine 220 from the pre-heat module 210 to the laser anneal module 204, and placed onto the heated chuck 234 on the stage 230. Laser anneal may then be performed in the laser anneal module 204 by applying the power laser beam 248 to a portion of the semiconductor wafer 202, such as the semiconductor device 100, to anneal a layer of the semiconductor device 100 and adjusting an applied intensity of the power laser beam 248 as a function of the measured intensity and the emissivity, where the applied intensity of the power laser beam 248 is indicative of a magnitude at which the power laser beam 248 is emitted toward the layer of the semiconductor device 100. After performing the laser anneal, the semiconductor wafer 202 may be transferred by the operating machine 220 from the stage 230 of the laser anneal chamber 232 to the post-cool module 212 for cooling thereof. After the semiconductor wafer 202 has sufficiently cooled, as set forth herein, the semiconductor wafer 202 may be transferred to a wafer storage device, such as the second wafer storage device 209. Other operations and/or process sequences of the laser anneal operation are within the scope of the present disclosure. For example, the operating machine 220 may transfer the semiconductor wafer 202 to a load port prior to transfer into the laser anneal module 204.

Figure 3:
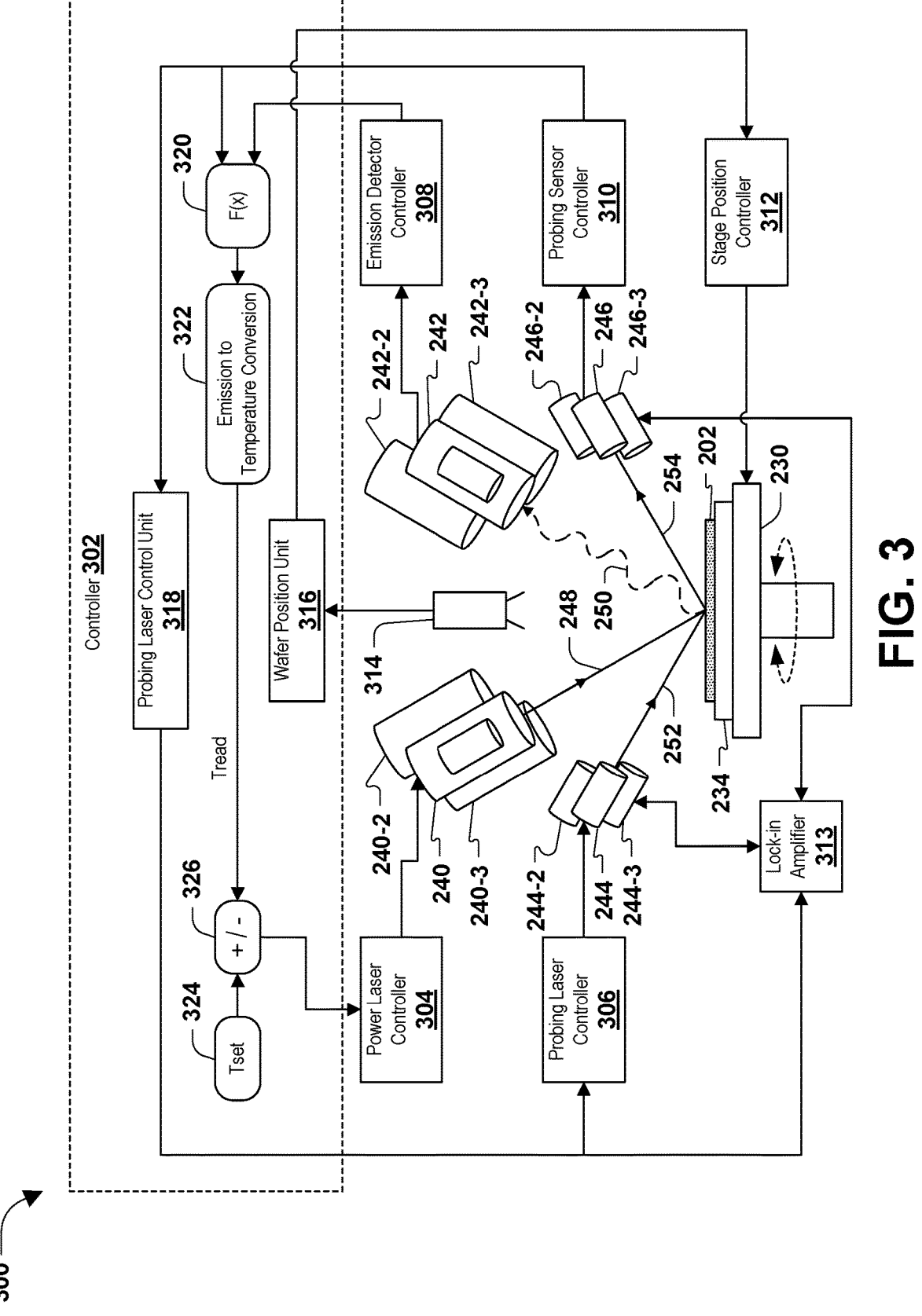
FIG. 3 illustrates an implementation of laser beam adjustment for semiconductor fabrication, according to some embodiments.

FIG. 3 illustrates an implementation 300 of laser beam adjustment for semiconductor fabrication, according to some embodiments. In some embodiments, laser beam adjustment may be provided during the laser anneal operation within the laser anneal module 204. In some embodiments, the implementation 300 includes a controller 302 for controlling one or more components of the laser anneal module 204, such as a power laser controller 304, a probing laser controller 306, an emission detector controller 308, a probing sensor controller 310, and a stage position controller 312. In some embodiments, some or all of the one or more of the components may be included in the controller 302. In some embodiments, one or more of the components may be controlled by communication signals communicated with the controller 302. For example, the controller 302 may output communication signals that cause the one or more components to execute the laser anneal operation according to a laser anneal recipe.

According to some embodiments, the power laser controller 304 communicates power process parameters to the power laser 240 for controlling operations thereof. For example, the power laser controller 304 may communicate power process parameters to control size, position, duration, mode, wavelength, and/or intensity of the power laser beam 248 based on a laser anneal recipe. For example the power laser 240 may be controlled to emit the power laser beam 248 with a size between 0.005 mm and 5.0 mm, such as 1 mm. In some embodiments, the power laser beam 248 may have a power laser beam width between 10 μm and 400 μm and a power laser beam length between 4 mm and 14 mm on a plane of the semiconductor wafer 202. The dimension of the power laser beam 248 is very small compared to the size of the semiconductor wafer 202, which may be, for example, between 200 mm and 600 mm, such as 300 mm. The power laser beam 248 may be positioned at an incidence angle tilted between 0° and 80°, such as 45°. The power laser beam 248 may be applied with a dwell time between 10 ρS and 800 ρS on a plane of the semiconductor wafer 202.

In some embodiments, the power laser beam 248 is emitted in a continuous-wave mode, a pulse mode, or another type of mode. In some embodiments, the power laser beam 248 is emitted with a fixed wavelength or a variable wavelength. For example, the power laser beam 248 may be emitted with a fixed wavelength between 5 μm and 20 μm, such as for example, 10.6 μm. In another example, the power laser beam 248 may be emitted with a variable wavelength between 1 μm and 30 μm. In some embodiments, the power laser beam 248 is emitted with an intensity between 2000 Watts and 4000 Watts, such as between 2500 Watts and 3500 Watts. After the attenuation of an optical system in the power laser 240, the actual power applied to the semiconductor wafer 202 may be between 5% and 20% of the power laser beam, such as about 10%. In some embodiments, the power laser beam 248 is polarized with respect the plane of the semiconductor wafer 202. In some embodiments, the power laser beam 248 is polarized with P-polarization or a fraction thereof approximating P-polarization with respect to the plane of the semiconductor wafer 202 to increase absorption thereof by the semiconductor wafer 202.

In some embodiments, the power laser controller 304 communicates power process parameters for controlling a plurality of power laser beams emitted from separate power lasers. For example, the power laser controller 304 may communicate second power process parameters to control size, position, duration, mode, wavelength, and/or intensity of a second power laser beam (not shown) emitted by a second power laser 240-2. Additionally, or alternatively, the power laser controller 304 may communicate third power process parameters to control size, position, duration, mode, wavelength, and/or intensity of a third power laser beam (not shown) emitted by a third power laser 240-3. In some embodiments, one of both of the second power laser 240-2 and the third power laser 240-3 may simultaneously emit respective laser beams onto the same portion of the semiconductor wafer. In some embodiments, one of both of the second power laser 240-2 and the third power laser 240-3 may sequentially emit respective laser beams onto the same portion of the semiconductor wafer, such as for example, to pre-heat the portion of the semiconductor wafer 202. In some embodiments, one of both of the second power laser 240-2 and the third power laser 240-3 may sequentially emit respective laser beams onto the same portion of the semiconductor wafer, such as for example, to stabilize the portion of the semiconductor wafer 202 and reduce material flow subsequent to laser anneal.

According to some embodiments, the probing laser controller 306 communicates probing process parameters to the probing laser 244 based on a laser anneal recipe and/or parameters of the power laser beam 248. In some embodiments, the probing laser 244 is a diode laser, a gas laser, a solid laser, or other type of laser. In some embodiments, the probing laser controller 306 may communicate probing process parameters to control size, position, duration, mode, wavelength, and/or intensity of the probing laser beam 252 based on a laser anneal recipe. For example the probing laser 244 may be controlled to emit the probing laser beam 252 with a size between 0.005 mm and 5.0 mm, such as about 1 mm. In some embodiments, the probing laser beam 252 is emitted with a size less than a size of the power laser beam 248. In some embodiments, the probing laser beam may have a probing laser beam width between 10 μm and 800 μm and a probing laser beam length between 6 mm and 9 mm on a plane of the semiconductor wafer 202. In some embodiments, the probing laser beam 252 is emitted with a probing laser beam width less than the power laser beam width and with a probing laser beam length less than the power laser beam length. The probing laser beam 252 may be positioned at an incidence angle tilted between 0° and 80°, such as 30°, 45°, or 60°. In some embodiments, the probing laser beam 252 may be positioned at the same incidence angle as the power laser beam 248. In some embodiments, the probing laser beam 252 may be positioned at a different incidence angle than the power laser beam 248. The probing laser beam 252 may be applied with a dwell time between 10 μS and 800 μS on a plane of the semiconductor wafer 202. In some embodiments, the probing laser beam 252 is applied with a dwell time less than a dwell time of the power laser beam 248.

In some embodiments, the probing laser beam 252 is emitted in a continuous-wave mode, a pulse mode, or another type of mode. In some embodiments, the probing laser beam 252 is emitted with a fixed wavelength or a variable wavelength. For example, the probing laser beam 252 may be emitted with a fixed wavelength between 0.01 μm and 2.0 μm, such as for example, less than 1.0 μm. In some embodiments, a probing laser beam wavelength less than 1.0 μm may optimize detection of emissivity variation by the probing sensor 246. In another example, the probing laser beam 252 may be emitted with a variable wavelength between 0.1 μm and 2.0 μm. In some embodiments, the probing laser beam 252 is emitted with an intensity between 1 mW and 200 mW, such as between 10 mW and 100 mW. In some embodiments, the probing laser beam 252 is polarized with respect the plane of the semiconductor wafer 202. In some embodiments, the probing laser beam 252 is polarized with S-polarization or a fraction thereof approximating S-polarization with respect to the plane of the semiconductor wafer 202 to minimize absorption thereof by the semiconductor wafer 202.

The probing laser controller 306 may communicate second probing process parameters to control size, position, duration, mode, wavelength, and/or intensity of a second probing laser beam (not shown) emitted by a second probing laser 244-2. Additionally, or alternatively, the probing laser controller 306 may communicate third probing process parameters to control size, position, duration, mode, wavelength, and/or intensity of a third probing laser beam (not shown) emitted by a third probing laser 244-3.

According to some embodiments, the emission detector controller 308 receives detected emission information, such as an emission count, from the emission detector 242 and communicates the emission information to the controller 302. In some embodiments, the detected emission information corresponds to temperature of the portion of the semiconductor wafer 202 subject to laser anneal by the power laser beam 248. In some embodiments, the emission detector controller 308 provides wavelength filtering of the detected emission information, as described in greater detail herein. In some embodiments, the emission detector controller 308 communicates emission process parameters to the emission detector 242 for controlling operations thereof. For example, the emission detector controller 308 may communicate emission process parameters to control position, duration, wavelength, and/or sensitivity of the emission detector 242 based on a laser anneal recipe.

In some embodiments, the emission detector controller 308 may receive second detected emission information, such as a second emission count, from a second emission detector 242-2 and communicates the second emission information to the controller 302. In some embodiments, the emission detector controller 308 may receive third detected emission information, such as a third emission count, from a third emission detector 242-3 and communicates the third emission information to the controller 302. In some embodiments, the second and third detected emission information, respectively, corresponds to temperature of the portion of the semiconductor wafer 202 subject to laser anneal by the power laser beam 248. In some embodiments, the emission detector controller 308 communicates second emission process parameters to control position, duration, wavelength, and/or sensitivity of the second emission detector 242-2. Additionally, or alternatively, the emission detector controller 308 may communicate third emission process parameters to control position, duration, wavelength, and/or sensitivity of the third emission detector 242-3. In some embodiments, the emission detector controller 308 filters the detected emission information from the emission detector 242 according to a first wavelength, filters the second detected emission information from the second emission detector 242-2 according to a second wavelength, and filters the third detected emission information from the third emission detector 242-3 according to a third wavelength. In some embodiments, the emission detector 242, the second emission detector 242-2, and the third emission detector 242-3 simultaneously communicate respective detected emission information to the emission detector controller 308 for, filtering and communication to the controller 302.

According to some embodiments, the probing sensor controller 310 receives reflection intensity information, such as an emission count, from the probing sensor 246 corresponding to a reflection intensity of the reflected laser beam 254. The reflection intensity information corresponds to a measurement of reflection intensity of the probing laser beam 252, where the reflection intensity is indicative of an emissivity of the portion of the semiconductor wafer 202 subject to laser anneal. In some embodiments, the probing sensor controller 310 communicates the reflection intensity information to the controller 302. In some embodiments, the reflection intensity information corresponds to emissivity of the portion of the semiconductor wafer 202 subject to laser anneal by the power laser beam 248. In some embodiments, the probing sensor controller 310 provides wavelength filtering of the detected emission information, as described in greater detail herein. In some embodiments, the probing sensor controller 310 communicates reflection process parameters to the probing sensor 246 for controlling operations thereof. For example, the probing sensor controller 310 may communicate reflection process parameters to control position, duration, wavelength, and/or sensitivity of the probing sensor 246 based on a laser anneal recipe.

In some embodiments, the probing sensor controller 310 may receive second reflection intensity information, such as a second emission count, from a second probing sensor 246-2 and communicates the second reflection intensity information to the controller 302. In some embodiments, the probing sensor controller 310 may receive third reflection intensity information, such as a third emission count, from a third probing sensor 246-3 and communicates the third reflection intensity information to the controller 302. In some embodiments, the second and third reflection intensity information, respectively, corresponds to temperature of the portion of the semiconductor wafer 202 subject to laser anneal by the power laser beam 248. In some embodiments, the probing sensor controller 310 communicates second reflection process parameters to control position, duration, wavelength, and/or sensitivity of the second probing sensor 246-2. Additionally, or alternatively, the probing sensor controller 310 may communicate third reflection process parameters to control position, duration, wavelength, and/or sensitivity of the third emission detector 242-3. In some embodiments, the probing sensor controller 310 filters the reflected intensity information from the probing sensor 246 according to a first wavelength, filters the second reflection intensity information from the second probing sensor 246-2 according to a second wavelength, and filters the third reflection intensity information from the third probing sensor 246-3 according to a third wavelength. In some embodiments, the probing sensor 246, the second probing sensor 246-2, and the third probing sensor 246-3 simultaneously communicate respective reflection intensity information to the probing sensor controller 310 for wavelength filtering and communication to the controller 302.

According to some embodiments, the implementation 300 includes a lock-in amplifier 313 to lock a frequency of the probing laser beam 252 emitted by the probing laser 244 to a detected frequency of the reflected laser beam 254 sensed by the probing sensor 246. In some embodiments, the probing laser 244, the probing sensor 246, and the lock-in amplifier 313 function as a pyrometer. In some embodiments, the lock-in amplifier 313 locks a second frequency of the second probing laser beam emitted by the second probing laser 244-2 to a second detected frequency of a second reflected laser beam sensed by the second probing sensor 246-2. In some embodiments, the lock-in amplifier 313 locks a third frequency of the third probing laser beam emitted by the third probing laser 244-3 to the third detected frequency of the third reflected laser beam sensed by the third probing sensor 246-3.

According to some embodiments, the stage position controller 312 controls a rotational position of the stage 230 for the laser anneal operation. In some embodiments, a position of the semiconductor wafer 202 is detected by a camera 314, such as a CMOS camera. For example, the position of the semiconductor wafer 202 may be optically detected by the camera 314 through detection of notch positions in the semiconductor wafer 202. In some embodiments, a wafer position unit 316 in the controller 302 receives position information from the camera 314 and communicates position control information to the stage position controller to control the position of the semiconductor wafer 202 during the laser anneal operation. In some embodiments, the controller includes a probing laser control unit 318 to control the probing laser 244 through the probing laser controller 306 based on probing sensor information received from the probing sensor controller and the recipe for laser anneal.

According to some embodiments, the controller 302 controls the laser anneal operation in response to communication signals from the emission detector controller 308 and the probing sensor controller 310. At 320, the controller 302 may be configured to determine a function F(x) of a reflection signal, R, corresponding to the reflected laser beam 254 collected from the probing sensor 246 and a thermal emission signal, E, corresponding to thermal emission 250 detected by the emission detector 242. The function F(x) is provided by equation 1 as follows:

$$F(x) = F(E, R) = \frac{\text{emissivity}}{E} = \frac{1-R}{E} \qquad \text{Equation 1}$$

where E is the detected emission, R is the reflection coefficient, and the relationship between emissivity and the reflection coefficient (R) is described by Kirchhoff's law of thermal radiation: absorption=1−R=emissivity.

In some embodiments and at 322, the calibrated emission signal is then subject to emission to temperature conversion. Temperature conversion is provided by equation 2 as follows:

$$\text{Temperature} = \frac{A}{\ln[1 + B * f(E, R)]} = \frac{A}{\ln[1 + B * \frac{1-R}{E}]} \qquad \text{Equation 2}$$

where A and B are constants related to wavelength, the optical system implemented during the laser anneal operation, light speed, Planck's constant, and Boltzmann constant. Therefore, based on the emissivity correction, the temperature reading is more accurate to the actual temperature of the semiconductor wafer 202. In some embodiments, emission to temperature conversion at 322 is provided by a look-up table during closed-loop control, and a read temperature Tread is determined therefrom.

At 324, a set temperature Tset is provided to the controller 302. At 326, the set temperature Tset is compared to the read temperature Tread and feedback control is provided to the power laser controller 304 to control an intensity of the power laser beam 248.

In some embodiments, during closed-loop control, temperature feedback may be provided to the controller 302 to control a temperature setting, according to a laser anneal recipe. In some embodiments, the controller 302 may provide feedback control to the power laser controller with a cycle time between 5 kilohertz and 20 kilohertz, such as 10 kilohertz. For example, at 10 kilohertz, the power laser controller 304 changes power of the power laser 240 with at frequency 10 kilohertz during the laser anneal operation. Power may be changed, for example, as the power laser beam 248 is repositioned to a different region and/or different semiconductor device of the semiconductor wafer 202 during rotation on the stage 230.

In some embodiments, power laser 240 may emit the power laser beam 248 at different power settings, such as between 1200 Watts and 3500 Watts. In some embodiments, the power laser 240 may emit the power laser beam 248 at a fixed power setting, such as about 2600 Watts. For example, the laser anneal module 204 may process different types of semiconductor wafers at a fixed power setting. Each semiconductor wafer may have a different emissivity due to the presence of semiconductor devices formed on the surface thereof. As set forth in greater detail herein, differences in emissivity may be used to adjust temperature measurement by the emission detector 242 to improve laser anneal in closed-loop control by the controller 302. For example, 2600 Watts of laser power emitted by the power laser 240 may correspond to a non-adjusted temperature on bulk silicon wafers of 1246° C. In this example, 2600 Watts of laser power emitted by the power laser 240 may correspond to a non-adjusted temperature on a structure silicon wafer of about 1205° C., where the difference in non-adjusted temperature measurement is due to differences in emissivity. In accordance with aspects of the present disclosure, adjusted temperature measurement may be provided for bulk silicon wafers and structure silicon wafers during closed-loop control by the controller 302.

According to some embodiments, the controller 302 adjusts the applied intensity of the power laser beam 248 to achieve a desired reflection intensity from the reflected laser beam 254. As set forth herein and according to some embodiments, the desired reflection intensity corresponds to the emissivity. In some embodiments, the controller 302 may adjust an amount of power supplied to the power laser 240 emitting the power laser beam 248 such that the power laser beam is applied to the semiconductor device 100 on the semiconductor wafer 202 to perform the anneal operation. In some embodiments, the controller 302 may apply the power laser beam 248 to the semiconductor device 100 with a power laser beam size, set forth herein, and apply the probing laser beam 252 to the semiconductor device 100 with a probing laser beam size less than the power laser beam size while applying the power laser beam 248 to the semiconductor device 100. In some embodiments, the controller 302 may adjust the power laser beam size based on the semiconductor device size. In some embodiments, the controller 302 may apply the power laser beam 248 to the semiconductor device 100 with a power laser beam width and a power laser beam length and apply the probing laser beam 252 to the semiconductor device 100 with a probing laser beam width less than the power laser beam width and a probing laser beam length less than the power laser beam length while applying the power laser beam 248 to the semiconductor device.

According to some embodiments, the controller 302 may apply the probing laser beam 252 to the semiconductor device 100 as a polarized probing laser beam. In some embodiments, the controller 302 may adjust an angle of incidence of the probing laser beam 252 to reduce absorption by the semiconductor device 100. In some embodiments, the controller 302 may measure the thermal emission 250 from the semiconductor device 100, for example by the emission detector 242, to obtain a measured intensity, calculate the read temperature Tread of the semiconductor device 100 based on the measured intensity and the emissivity, for example at 322. The controller 302 may then compare the read temperature Tread to the set temperature Tset of the semiconductor device 100 for performing an anneal operation on the semiconductor device 100 to determine a degree of deviation. In some embodiments, the controller 302 may adjust the applied intensity when the degree of deviation exceeds a threshold and not adjust the applied intensity when the degree of deviation does not exceed the threshold.

Figure 4:
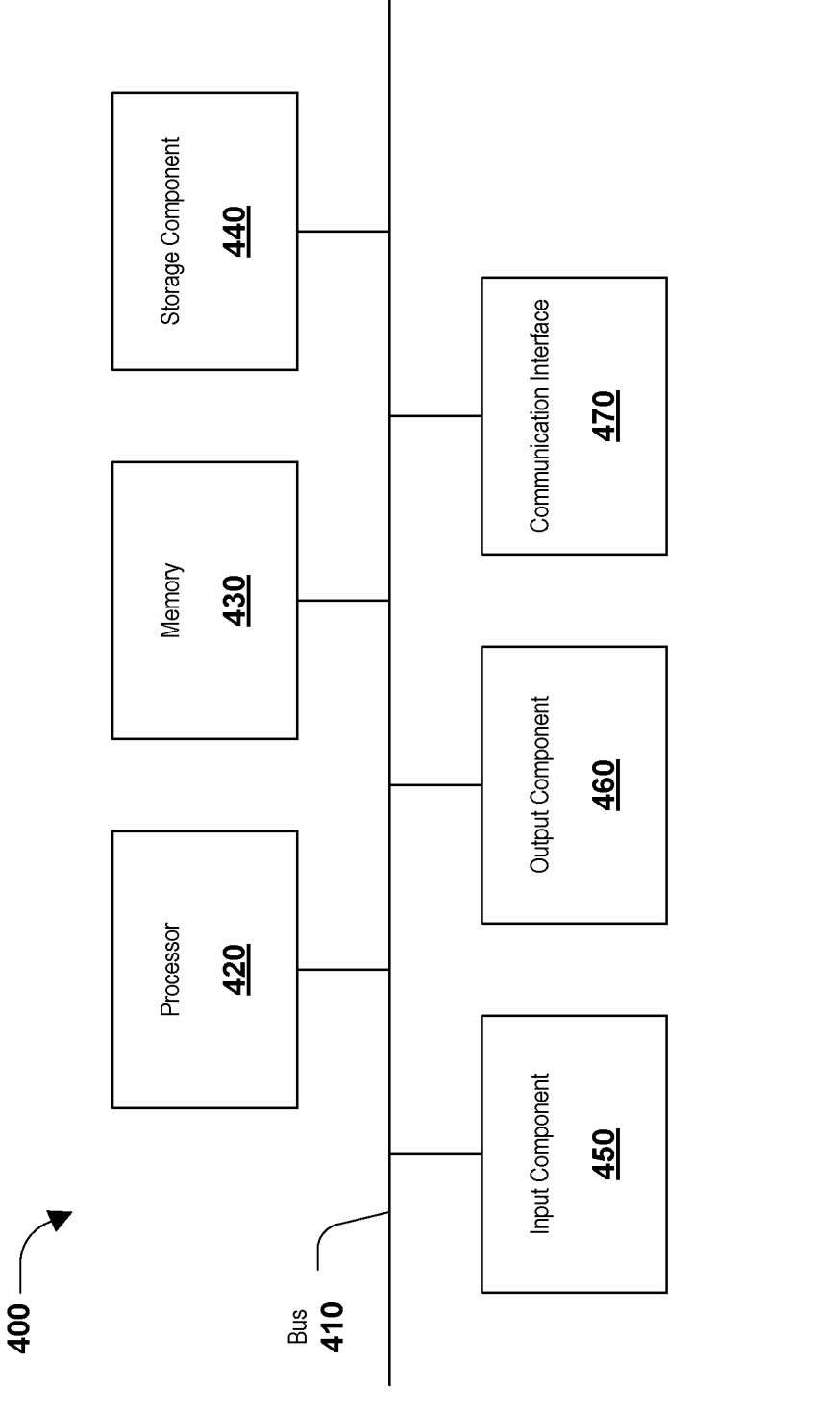
FIG. 4 illustrates example components of a device, according to some embodiments.

FIG. 4 illustrates example components of a device 400, according to some embodiments. According to some embodiments, the device 400 may correspond to the controller 302. As illustrated in FIG. 4, the device 400 may include a bus 410, a processor 420, a memory 430, a storage component 440, an input component 450, an output component 460, and a communication interface 470. The bus 410 may include a component that permits communication among the components of the device 400. The processor 420 may be implemented in hardware, firmware, or a combination of hardware and software. The processor 420 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), another type of processing component, or a combination thereof. In some implementations, the processor 420 includes one or more processors capable of being programmed to perform a function. The memory 430 may include a random access memory (RAM), a read only memory (ROM), and/or another type of dynamic or static storage device (e.g., a flash memory, a magnetic memory, and/or an optical memory) that stores information and/or instructions for use by the processor 420.

The storage component 440 stores information and/or software related to the operation and use of the device 400. For example, the storage component 440 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive. The input component 450 includes a component that permits the device 400 to receive information, such as via user input (e.g., a touch screen display, a keyboard, a keypad, a mouse, a button, a switch, and/or a microphone). Additionally, or alternatively, the input component 450 may include a sensor for sensing information (e.g., a global positioning system (GPS) component, an accelerometer, a gyroscope, an actuator, and/or another type of sensor). The output component 460 may include a component that provides output information from device 400 (e.g., a display, a speaker, and/or one or more light-emitting diodes (LEDs)). The communication interface 470 includes a transceiver-like component (e.g., a transceiver and/or a separate receiver and transmitter) that enables the device 400 to communicate with other devices, such as via a wired connection, a wireless connection, or a combination of wired and wireless connections. The communication interface 470 may permit the device 400 to receive information from another device and/or provide information to another device. For example, the communication interface 470 may include an Ethernet interface, an optical interface, a coaxial interface, an infrared interface, a radio frequency (RF) interface, a universal serial bus (USB) interface, a Wi-Fi interface, a cellular network interface, and/or the like.

The device 400 may perform one or more processes described herein. The device 400 may perform these processes based on the processor 420 executing software instructions stored by a non-transitory computer-readable medium, such as the memory 430 and/or the storage component 440. A computer-readable medium is defined herein as a non-transitory memory device. A memory device may include memory space within a single physical storage device or memory space spread across multiple physical storage devices. Software instructions may be read into the memory 430 and/or the storage component 440 from another computer-readable medium or from another device via the communication interface 470. When executed, software instructions stored in the memory 430 and/or the storage component 440 may cause the processor 420 to perform one or more processes described herein. Additionally, or alternatively, hardwired circuitry may be used in place of or in combination with software instructions to perform one or more processes described herein. Thus, implementations described herein are not limited to any specific combination of hardware circuitry and software. The number and arrangement of the components shown in FIG. 4 are provided as an example. In practice, the device 400 may include additional components, fewer components, different components, or differently arranged components than those shown in FIG. 4. Additionally, or alternatively, a set of components (e.g., one or more components) of device 400 may perform one or more functions described as being performed by another set of components of the device 400.

Figure 5:
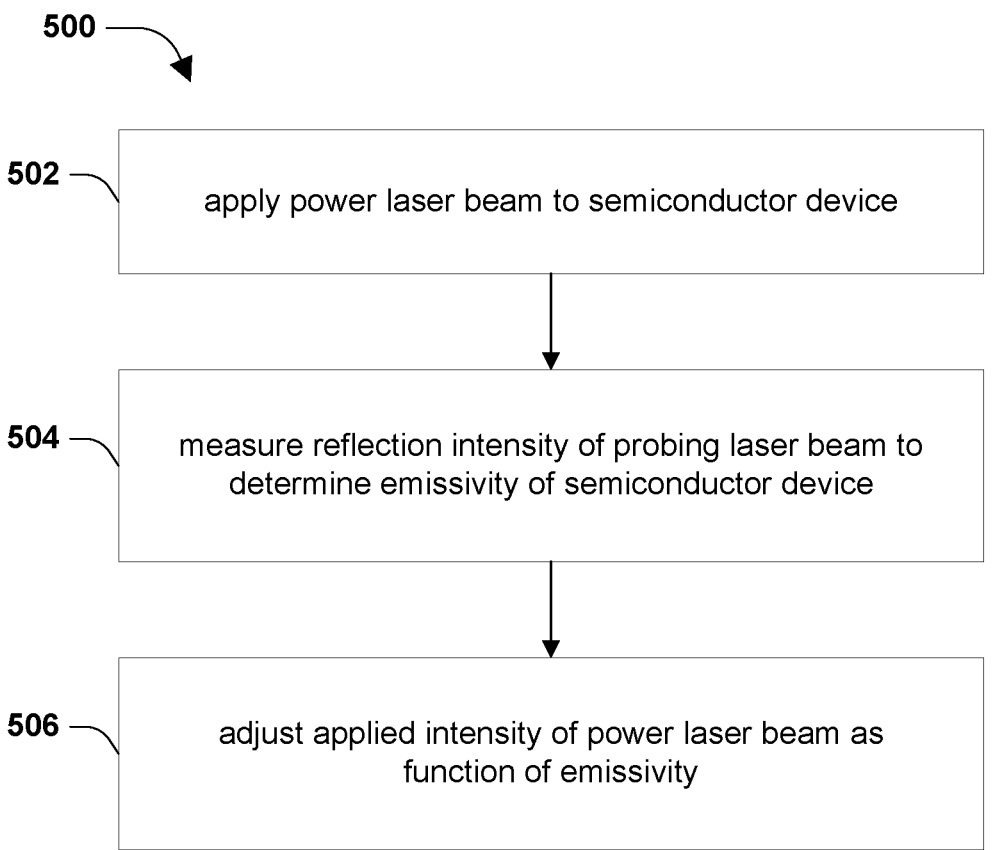
FIG. 5 illustrates an example method, according to some embodiments.

FIG. 5 illustrates an example method 500 for adjusting an intensity of a power laser beam applied to a semiconductor device. Some of the operations described can be replaced and/or eliminated for different embodiments. At 502, a power laser beam is applied to a semiconductor device. An applied intensity of the power laser beam is indicative of a magnitude at which the power laser beam is emitted toward the semiconductor device and a reflection intensity of a probing laser beam applied to the semiconductor device is indicative of an emissivity of the semiconductor device.

At 504, the reflection intensity of the probing laser beam is measured to determine the emissivity of the semiconductor device.

At 506, the applied intensity of the power laser beam is adjusted as a function of the emissivity. Other and/or additional operations of adjusting an intensity of a power laser beam are within the scope of the present disclosure.

FIG. 6 illustrates an example method 600 of annealing a semiconductor device. Some of the operations described can be replaced and/or eliminated for different embodiments. At 602, a power laser beam is applied to the semiconductor device to anneal a layer of the semiconductor device.

At 604, thermal emission from the layer of the semiconductor device is measured to obtain a measured intensity.

At 606, a probing laser beam is applied to the layer of the semiconductor device.

At 608, a reflection intensity of the probing laser beam is measured, where the reflection intensity is indicative of an emissivity of the layer of the semiconductor device.

At 610, an applied intensity of the power laser beam is adjusted as a function of the measured intensity and the emissivity, where the applied intensity of the power laser beam is indicative of a magnitude at which the power laser beam is emitted toward the layer of the semiconductor device. Other and/or additional operations of adjusting an intensity of a power laser beam are within the scope of the present disclosure.

According to some embodiments, a method for adjusting an intensity of a power laser beam applied to a semiconductor device is provided. An applied intensity of the power laser beam is indicative of a magnitude at which the power laser beam is emitted toward the semiconductor device and a reflection intensity of a probing laser beam applied to the semiconductor device is indicative of an emissivity of the semiconductor device. The method includes measuring the reflection intensity of the probing laser beam to determine the emissivity of the semiconductor device, and adjusting the applied intensity of the power laser beam as a function of the emissivity.

According to some embodiments, a system for semiconductor wafer processing is provided. A power laser is configured to emit a power laser beam that performs an anneal operation on a region of a semiconductor wafer and an emission detector is configured to detect a measured intensity of thermal emission from the region of the semiconductor wafer. A probing laser is configured to emit a probing laser beam onto the region of the semiconductor wafer and a probing sensor is configured to measure a reflection intensity of the probing laser beam, where the reflection intensity indicative of an emissivity of the region of the semiconductor wafer. A controller is configured to adjust an applied intensity of the power laser beam as a function of the measured intensity and the emissivity, where the applied intensity is indicative of a magnitude at which the power laser beam is emitted from the power laser toward the region of the semiconductor wafer.

According to some embodiments, a method of annealing a semiconductor device is provided. The method includes applying a power laser beam to the semiconductor device to anneal a layer of the semiconductor device and measuring thermal emission from the layer of the semiconductor device to obtain a measured intensity. The method includes applying a probing laser beam to the layer of the semiconductor device and measuring a reflection intensity of the probing laser beam, where the reflection intensity is indicative of an emissivity of the layer of the semiconductor device. The method includes adjusting an applied intensity of the power laser beam as a function of the measured intensity and the emissivity, where the applied intensity of the power laser beam is indicative of a magnitude at which the power laser beam is emitted toward the layer of the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, ion implantation techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings.

The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for adjusting an intensity of a power laser beam applied to a semiconductor device by a power laser, wherein an applied intensity of the power laser beam is indicative of a magnitude at which the power laser beam is emitted toward the semiconductor device and wherein a reflection intensity of a probing laser beam applied to the semiconductor device is indicative of an emissivity of the semiconductor device, comprising:

measuring the reflection intensity of the probing laser beam applied by a probing laser to determine the emissivity of the semiconductor device, wherein the probing laser is different than the power laser; and adjusting the applied intensity of the power laser beam as a function of the emissivity.

2. The method of claim 1, the adjusting comprising:

adjusting the applied intensity to achieve a desired reflection intensity.

3. The method of claim 1, the adjusting comprising:

adjusting an amount of power supplied to the power laser emitting the power laser beam; and applying the power laser beam to the semiconductor device to perform an anneal operation.

4. The method of claim 1, comprising:

applying the power laser beam to the semiconductor device with a power laser beam size; and applying the probing laser beam to the semiconductor device with a probing laser beam size less than the power laser beam size while applying the power laser beam to the semiconductor device.

5. The method of claim 4, wherein the semiconductor device has a semiconductor device size, comprising:

adjusting the power laser beam size based on the semiconductor device size.

6. The method of claim 1, comprising:

applying the power laser beam to the semiconductor device with a power laser beam width and a power laser beam length; and applying the probing laser beam to the semiconductor device with a probing laser beam width less than the power laser beam width and a probing laser beam length less than the power laser beam length while applying the power laser beam to the semiconductor device.

7. The method of claim 1, comprising:

applying the probing laser beam to the semiconductor device as a polarized probing laser beam.

8. The method of claim 1, comprising:

adjusting an angle of incidence of the probing laser beam to reduce absorption by the semiconductor device.

9. The method of claim 1, comprising:

measuring thermal emission from the semiconductor device to obtain a measured intensity;

calculating a read temperature of the semiconductor device based on the measured intensity and the emissivity; and comparing the read temperature to a set temperature of the semiconductor device for performing an anneal operation on the semiconductor device to determine a degree of deviation.

10. The method of claim 9, the adjusting comprising:

adjusting the applied intensity when the degree of deviation exceeds a threshold; and not adjusting the applied intensity when the degree of deviation does not exceed the threshold.

11. A method of annealing a semiconductor device, comprising:

applying a power laser beam by a power laser to the semiconductor device to anneal a layer of the semiconductor device;

measuring thermal emission from the layer of the semiconductor device to obtain a measured intensity;

applying a probing laser beam by a probing laser to the layer of the semiconductor device, wherein the probing laser is different than the power laser;

measuring a reflection intensity of the probing laser beam, the reflection intensity indicative of an emissivity of the layer of the semiconductor device; and adjusting an applied intensity of the power laser beam as a function of the measured intensity and the emissivity, the applied intensity of the power laser beam indicative of a magnitude at which the power laser beam is emitted toward the layer of the semiconductor device.

12. The method of claim 11, wherein adjusting the applied intensity of the power laser beam comprises:

calculating a read temperature of the layer of the semiconductor device based on the measured intensity and the emissivity; and comparing the read temperature to a set temperature of the layer of the semiconductor device for annealing the layer of the semiconductor device to determine a degree of deviation.

13. The method of claim 12, wherein adjusting the applied intensity of the power laser beam comprises:

adjusting the applied intensity when the degree of deviation exceeds a threshold by adjusting an amount of power supplied to the power laser emitting the power laser beam.

14. The method of claim 11, wherein:

applying the power laser beam comprises modulating the power laser beam at a first frequency, and applying the probing laser beam comprises modulating the probing laser beam at a second frequency different than the first frequency.

15. The method of claim 11, wherein measuring the thermal emission from the layer of the semiconductor device comprises measuring the thermal emission from the layer of the semiconductor device by a first emission detector configured to detect the measured intensity of the thermal emission from the layer of the semiconductor device at a first wavelength.

16. The method of claim 15, wherein:

measuring the thermal emission from the layer of the semiconductor device comprises measuring the thermal emission from the layer of the semiconductor device by a second emission detector configured to detect a second measured intensity of the thermal emission from the layer of the semiconductor device at a second wavelength different than the first wavelength, and adjusting the applied intensity of the power laser beam comprises adjusting the applied intensity of the power laser beam as a function of the measured intensity, the second measured intensity, and the emissivity.

17. The method of claim 16, wherein:

measuring the thermal emission from the layer of the semiconductor device comprises measuring the thermal emission from the layer of the semiconductor device by a third emission detector configured to detect a third measured intensity of the thermal emission from the layer of the semiconductor device at a third wavelength different than the first wavelength and different than the second wavelength, and adjusting the applied intensity of the power laser beam comprises adjusting the applied intensity of the power laser beam as a function of the measured intensity, the second measured intensity, the third measured intensity, and the emissivity.

18. The method of claim 11, wherein:

applying the power laser beam comprising emitting the power laser beam from a $CO_2$ laser configured to emit the power laser beam at greater than 2000 watts, and applying the probing laser beam comprises emitting the probing laser beam at less than 100 milli watts and at a wavelength of less than 1 micrometer.

19. The method of claim 11, wherein:

measuring the thermal emission from the layer of the semiconductor device comprises detecting the thermal emission from the layer of the semiconductor device as a photo-multiplier tube (PMT) count of atomic units of charge, and adjusting the applied intensity of the power laser beam as a function of the measured intensity and the emissivity comprises:

calculating a read temperature of the layer of the semiconductor device based on the PMT count and the emissivity;

comparing the read temperature to a set temperature of the layer of the semiconductor device for annealing the layer of the semiconductor device; and adjusting the applied intensity of the power laser beam based on the comparison of the read temperature to the set temperature.

20. A method for annealing a semiconductor device, comprising:

applying a power laser beam by a power laser to the semiconductor device to anneal a layer of the semiconductor device;

measuring thermal emission from the layer of the semiconductor device due to the annealing by detecting the thermal emission from the layer of the semiconductor device as a photo-multiplier tube (PMT) count of atomic units of charge;

determining an emissivity of the layer of the semiconductor device using a probing laser beam emitted by a probing laser different than the power laser;

calculating a read temperature of the layer of the semiconductor device based on the PMT count and the emissivity;

comparing the read temperature to a set temperature of the layer of the semiconductor device for annealing the layer of the semiconductor device; and adjusting an applied intensity of the power laser beam based on the comparison of the read temperature to the set temperature.

* * * * *